United States Patent
Meyer et al.

(10) Patent No.: US 9,620,673 B2
(45) Date of Patent: Apr. 11, 2017

(54) OPTOELECTRONIC COMPONENT AND METHOD OF PRODUCING AN OPTOELECTRONIC COMPONENT

(71) Applicant: OSRAM Opto Semiconductors GmbH, Regensburg (DE)

(72) Inventors: Tobias Meyer, Ihrlerstein (DE); Christian Leirer, Friedberg (DE); Lorenzo Zini, Regensburg (DE); Jürgen Off, Regensburg (DE); Andreas Löffler, Neutraubling (DE); Adam Bauer, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/782,911

(22) PCT Filed: Mar. 24, 2014

(86) PCT No.: PCT/EP2014/055857
§ 371 (c)(1),
(2) Date: Oct. 7, 2015

(87) PCT Pub. No.: WO2014/166724
PCT Pub. Date: Oct. 16, 2014

(65) Prior Publication Data
US 2016/0049543 A1   Feb. 18, 2016

(30) Foreign Application Priority Data
Apr. 10, 2013 (DE) .................. 10 2013 103 601

(51) Int. Cl.
*H01L 33/02* (2010.01)
*H01L 33/00* (2010.01)
(Continued)

(52) U.S. Cl.
CPC ........ *H01L 33/025* (2013.01); *H01L 33/0008* (2013.01); *H01L 33/14* (2013.01);
(Continued)

(58) Field of Classification Search
None
See application file for complete search history.

(56) References Cited

U.S. PATENT DOCUMENTS 5,550,391 A * 8/1996 Yamaguchi ................ B41J 2/45
257/102
6,054,716 A    4/2000 Sonobe et al.
(Continued)

FOREIGN PATENT DOCUMENTS

DE        102 60 937 A1    7/2004
DE    10 2011 100 037 A1   10/2012
(Continued)

OTHER PUBLICATIONS

Notice of Reasons for Rejection dated Oct. 4, 2016, of corresponding Japanese Application No. 2016-506836 in English.

*Primary Examiner* — Khaja Ahmad
(74) *Attorney, Agent, or Firm* — DLA Piper LLP (US)

(57) ABSTRACT

An optoelectronic device includes a carrier on which a semiconductor layer sequence is applied, said semiconductor layer sequence including an n-doped semiconductor layer and a p-doped semiconductor layer such that a p-n junction is formed which includes an active zone that generates electromagnetic radiation, wherein at least one of the n-doped semiconductor layer and the p-doped semiconductor layer includes a doped region having a first doping concentration greater than a second doping concentration in a surrounding area of the region in the semiconductor layer including the region.

16 Claims, 13 Drawing Sheets

(51) Int. Cl.
  *H01L 33/14*  (2010.01)
  *H01L 27/15*  (2006.01)
  *H01L 33/38*  (2010.01)

(52) U.S. Cl.
  CPC ............ *H01L 27/15* (2013.01); *H01L 33/005* (2013.01); *H01L 33/382* (2013.01)

(56) References Cited

U.S. PATENT DOCUMENTS

| | | |
|---|---|---|
| 8,963,120 B2 | 2/2015 | Bergenek et al. |
| 2006/0181828 A1 | 8/2006 | Sato et al. |
| 2009/0014713 A1 | 1/2009 | Kang et al. |
| 2009/0159869 A1 | 6/2009 | Ponce et al. |
| 2010/0133562 A1 | 6/2010 | Zhang et al. |
| 2010/0155704 A1 | 6/2010 | Oh et al. |
| 2012/0319126 A1 | 12/2012 | Butendeich et al. |
| 2013/0082273 A1* | 4/2013 | Ting ............... H01L 21/02458 257/76 |
| 2014/0183594 A1* | 7/2014 | Loffler ............. H01L 33/025 257/103 |
| 2015/0115290 A1* | 4/2015 | Guenard ........... H01L 27/142 257/79 |

FOREIGN PATENT DOCUMENTS

| | | |
|---|---|---|
| EP | 1 750 309 A2 | 2/2007 |
| JP | 4-212478 | 8/1992 |
| JP | 11-220169 | 8/1999 |
| JP | 2002-368269 | 12/2002 |
| JP | 2008-297191 | 12/2008 |
| JP | 2010-153838 | 7/2010 |
| JP | 2012-064647 A | 3/2012 |
| WO | 2011/080219 A1 | 7/2011 |

* cited by examiner

FIG 3
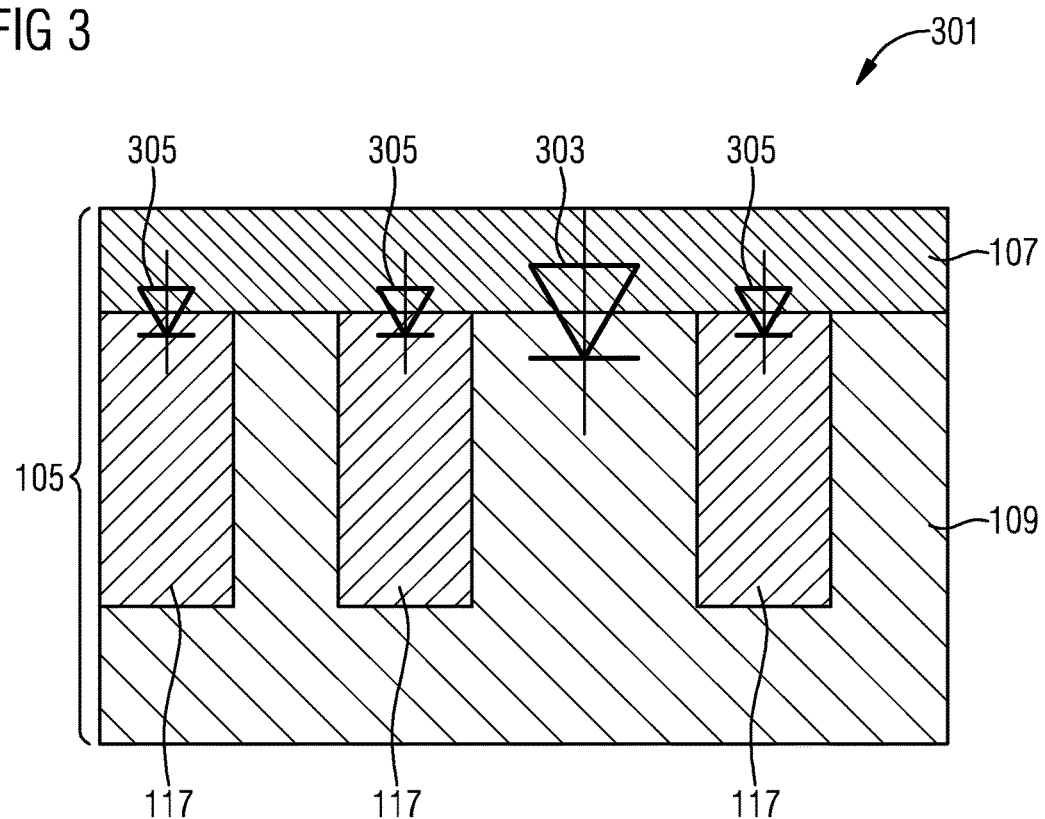
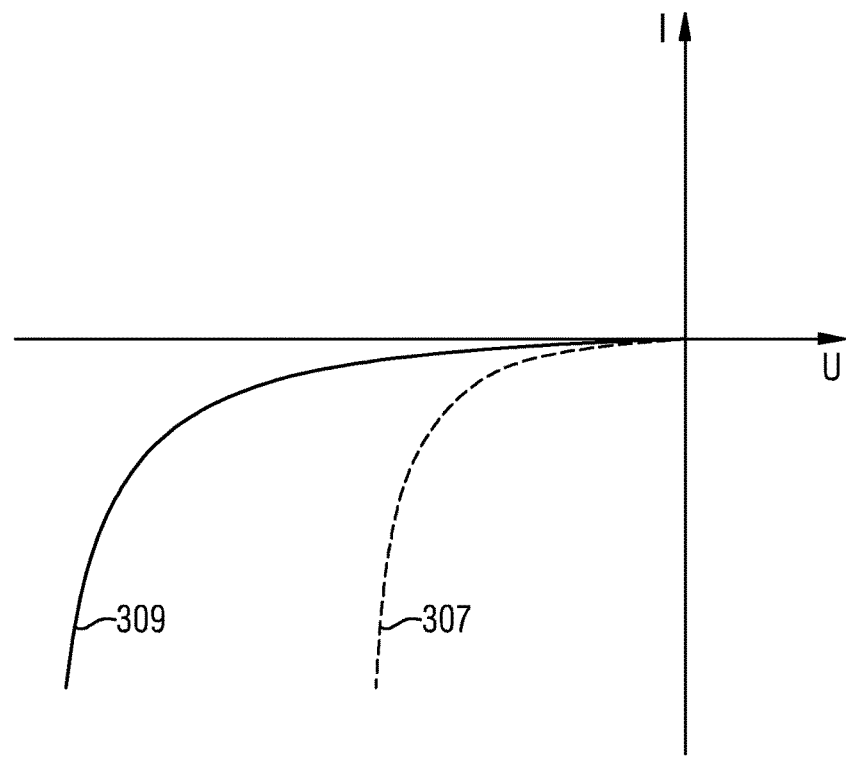

FIG 6
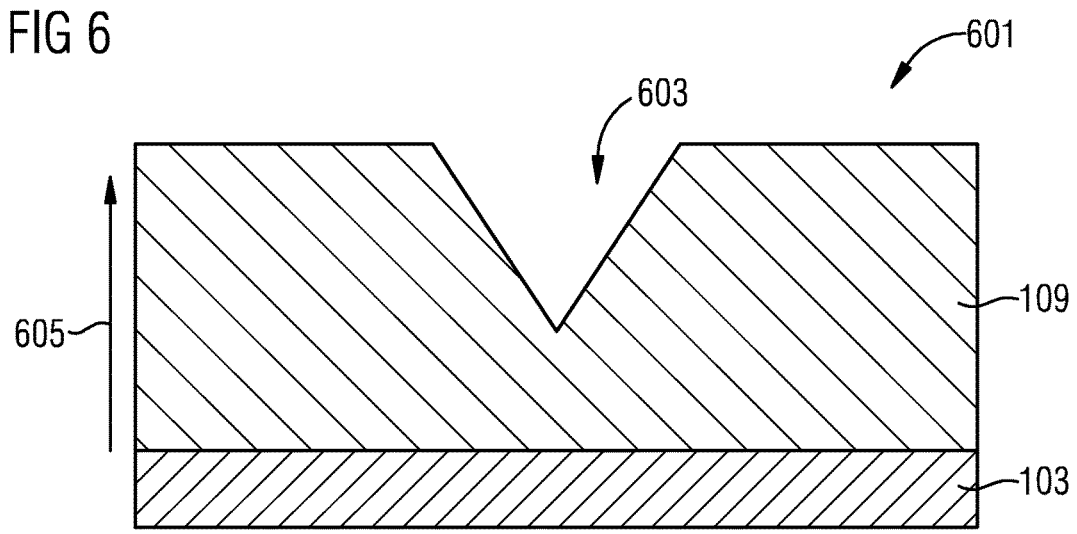
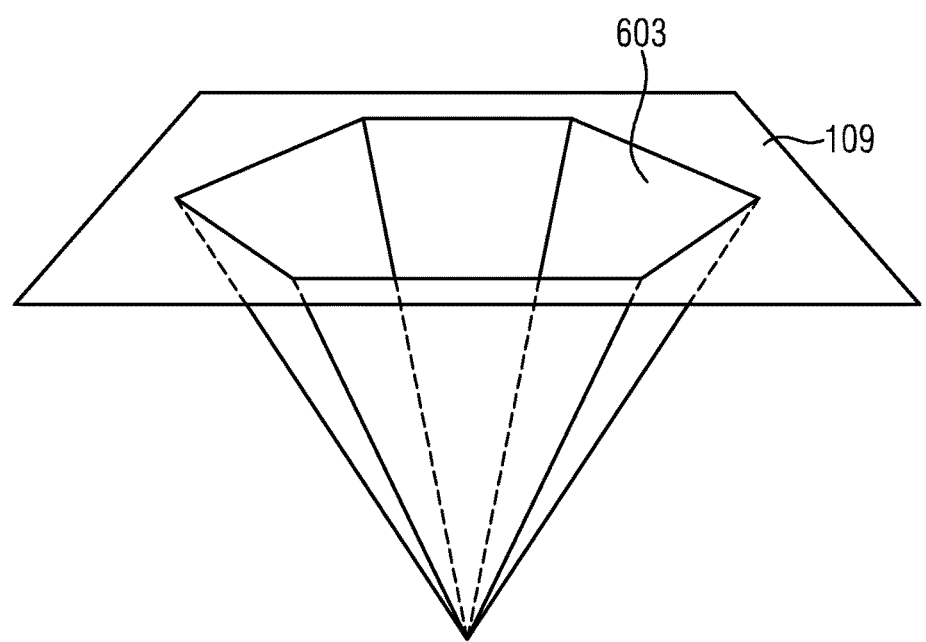

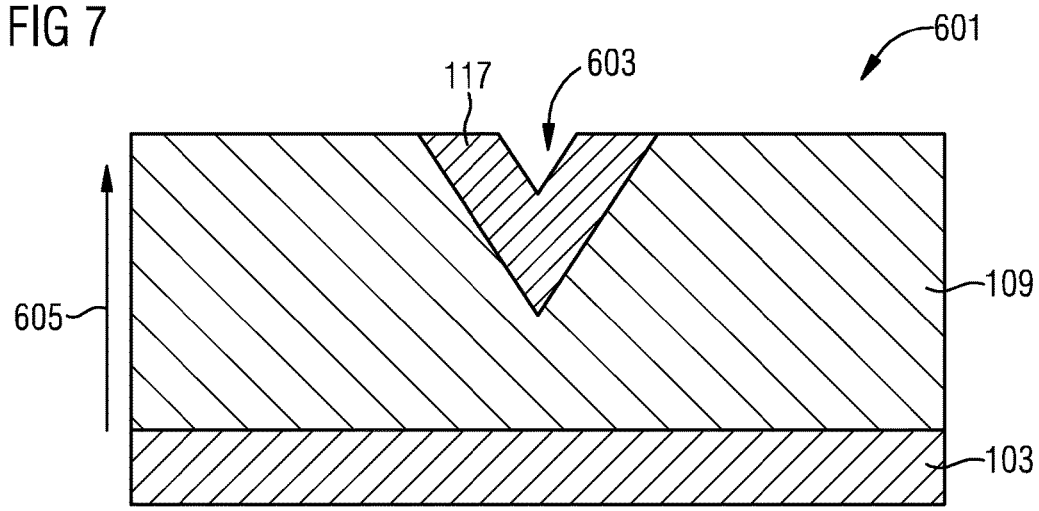
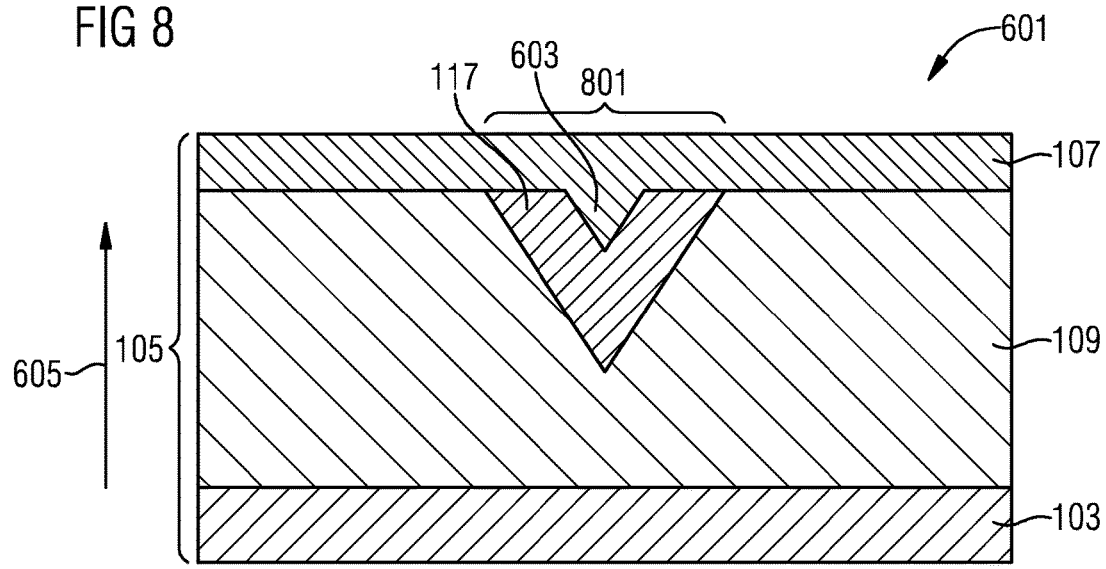

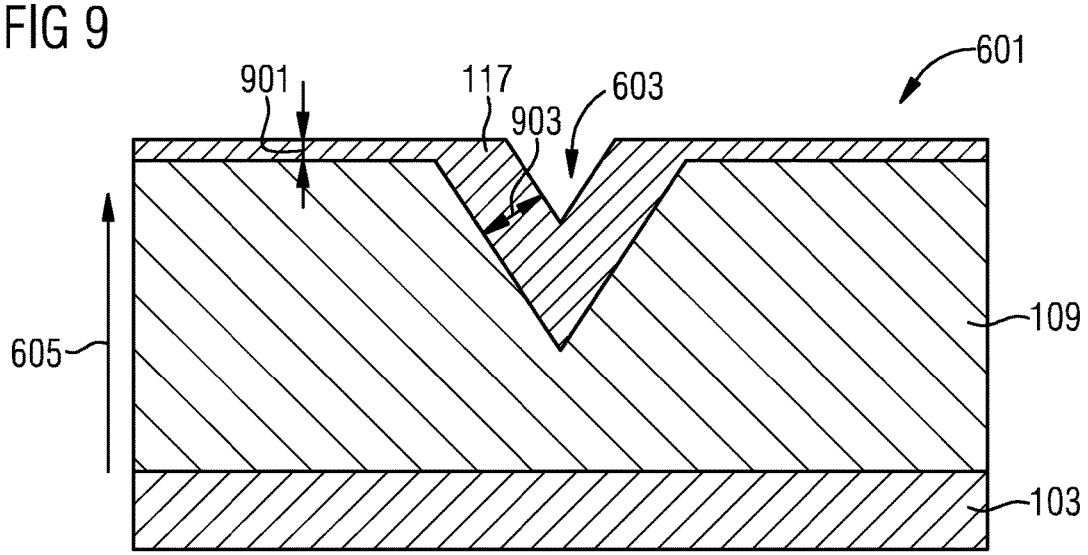
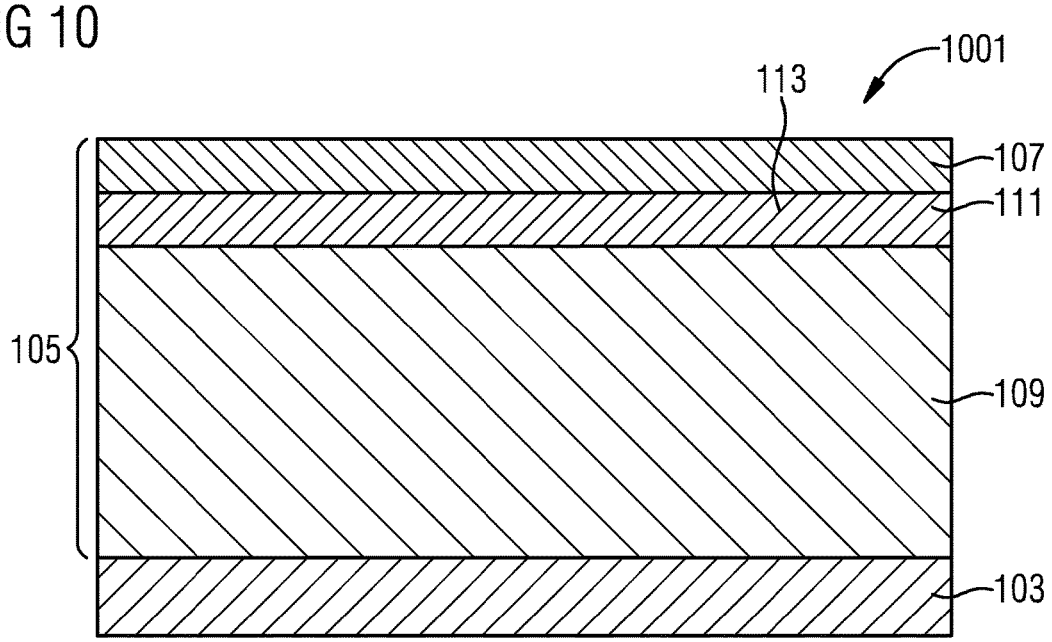

FIG 13
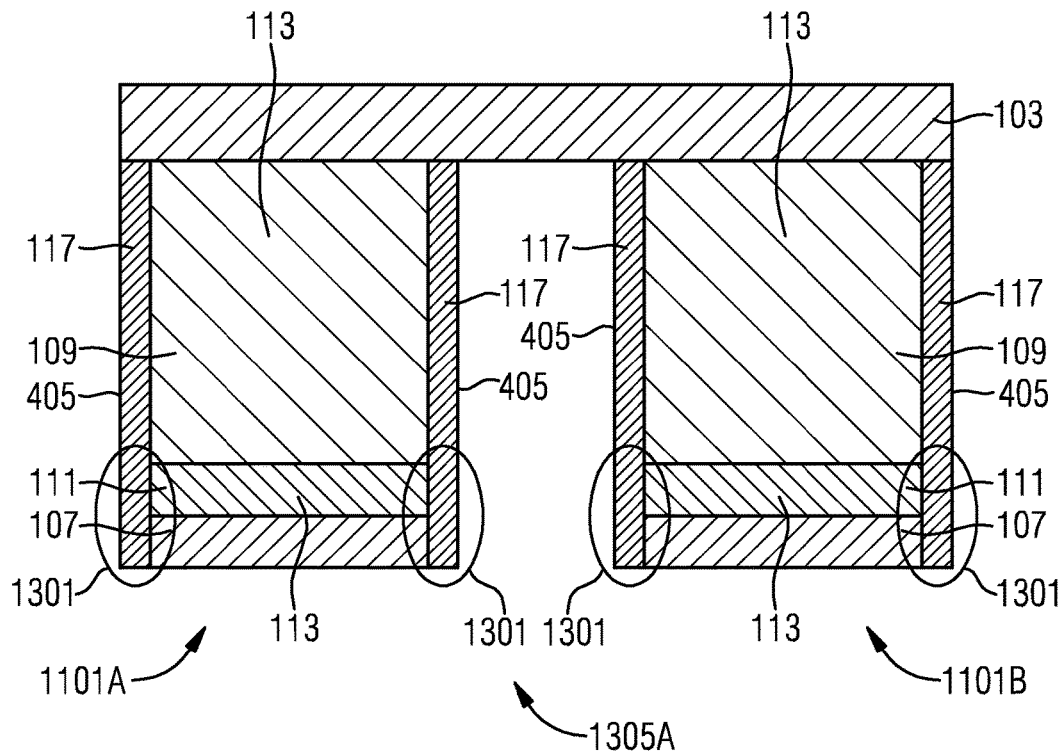
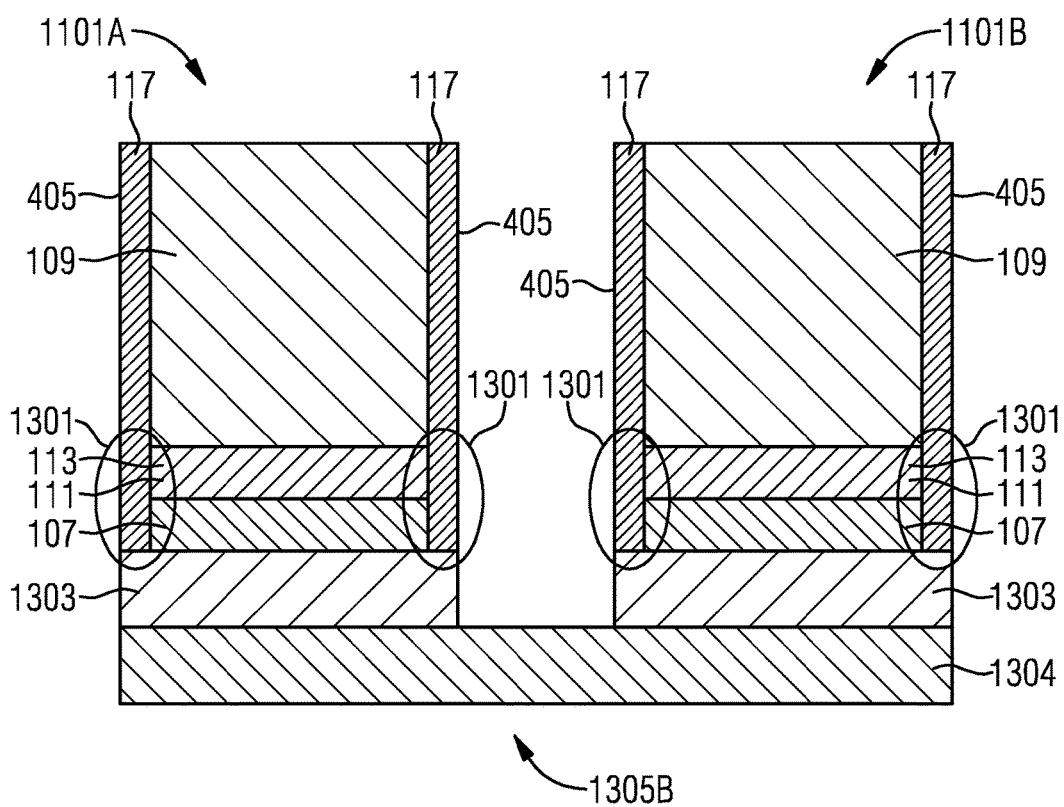

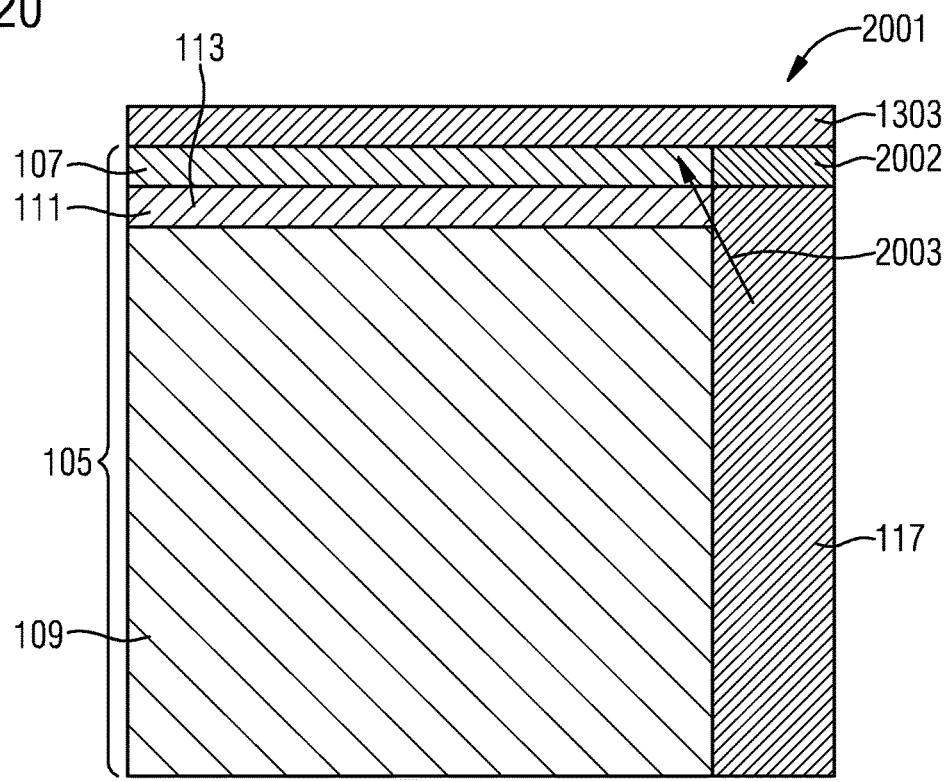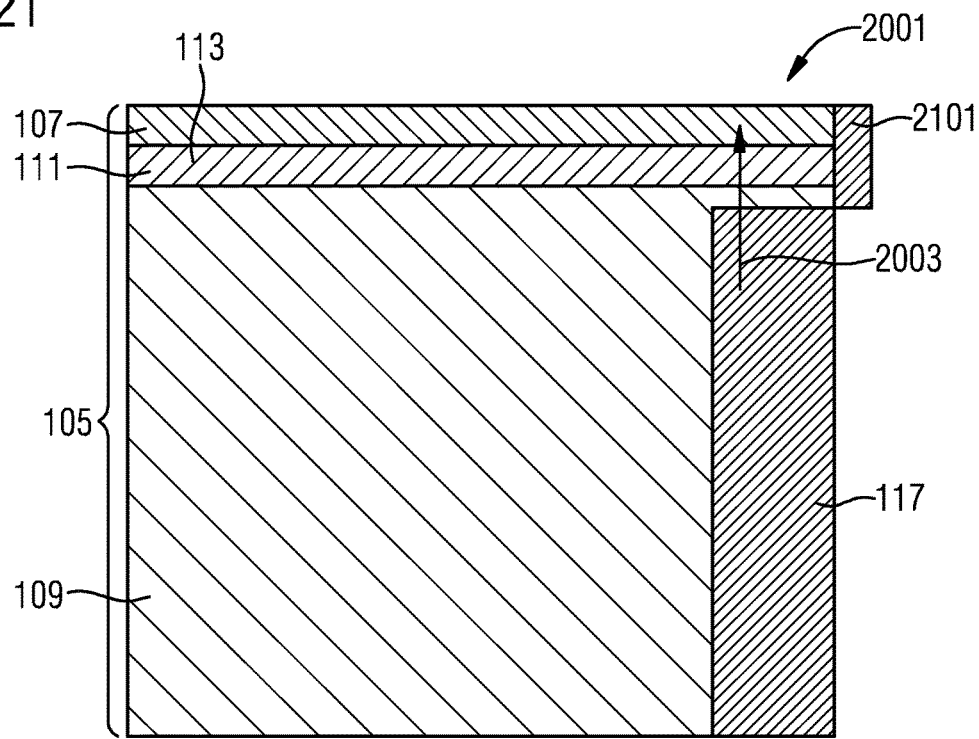

OPTOELECTRONIC COMPONENT AND METHOD OF PRODUCING AN OPTOELECTRONIC COMPONENT

TECHNICAL FIELD

This disclosure relates to an optoelectronic device and a method of producing an optoelectronic device.

BACKGROUND

Low electrostatic discharges can permanently damage optoelectronic devices. Such an optoelectronic device can be, for example, an indium-gallium-nitride chip. There is thus a requirement for measures to protect against such electrostatic discharges. It could therefore be helpful to provide an optoelectronic device that is more effectively protected against damage caused by electrostatic discharges as well as a corresponding method of producing an optoelectronic device.

SUMMARY

We provide an optoelectronic device including a carrier on which a semiconductor layer sequence is applied, said semiconductor layer sequence including an n-doped semiconductor layer and a p-doped semiconductor layer such that a p-n junction is formed which includes an active zone that generates electromagnetic radiation, wherein at least one of the n-doped semiconductor layer and the p-doped semiconductor layer includes a doped region having a first doping concentration greater than a second doping concentration in a surrounding area of the region in the semiconductor layer comprising the region.

We further provide a method of producing an optoelectronic device including applying a semiconductor layer sequence on a carrier and includes an n-doped and a p-doped semiconductor layer, and forming a p-n junction including an active zone that generates electromagnetic radiation, wherein a region of the at least one of the n-doped and p-doped semiconductor layers is provided with a dopant so that the region is doped with a first doping concentration greater than a second doping concentration in a surrounding area of the region in the semiconductor layer including the region.

We yet further provide an optoelectronic device including a carrier on which a semiconductor layer sequence is applied, said semiconductor layer sequence including an n-doped semiconductor layer and a p-doped semiconductor layer such that a p-n junction is formed which includes an active zone that generates electromagnetic radiation, wherein at least one of the n-doped semiconductor layer and the p-doped semiconductor layer includes a doped region having a first doping concentration greater than a second doping concentration in a surrounding area of the region in the semiconductor layer including the region, the doped regions each have a lower breakdown voltage in a reverse direction for the p-n junction than the breakdown voltage in the reverse direction in the surrounding areas of the doped regions, the doped regions are arranged laterally spaced apart from each other, and regions having the second doping concentration are provided between adjacent doped regions in each case.

BRIEF DESCRIPTION OF THE DRAWINGS

FIG. 3 shows a further optoelectronic device.
FIGS. 6 to 9 show a further optoelectronic device at different points in time of production.
FIGS. 10 to 13 show another optoelectronic device at different points in time of production.
FIGS. 20 to 22 show yet another optoelectronic device at different points in time of production.

Figure 1:
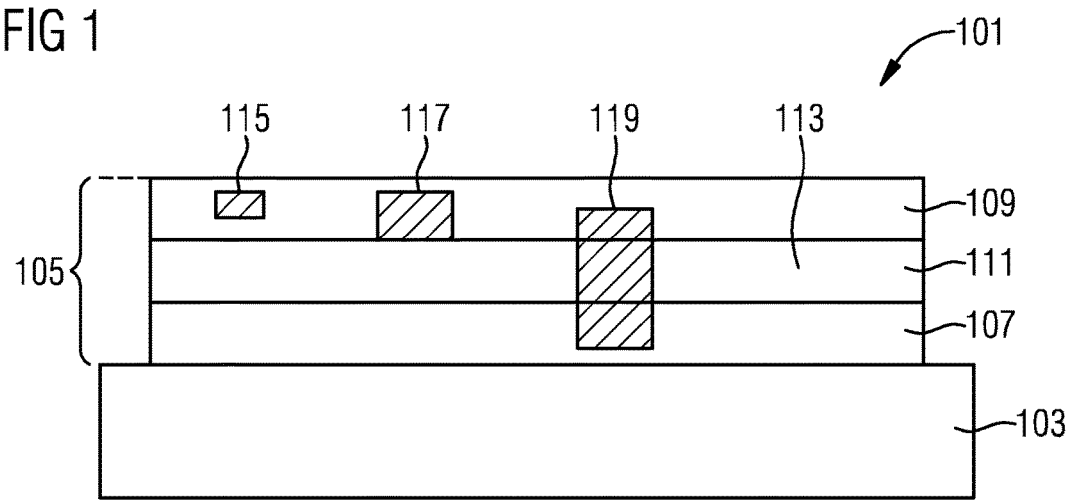
FIG. 1 shows an optoelectronic device.

| | List of reference numerals |
|---|---|
| 101 | Optoelectronic device |
| 103 | Carrier |
| 105 | Semiconductor layer sequence |
| 107 | p-doped semiconductor layer |
| 109 | n-doped semiconductor layer |
| 111 | p-n junction |
| 113 | Active zone |
| 115 | Doped region |
| 117 | " |
| 119 | " |
| 201 | Applying the semiconductor layer sequence |
| 203 | p-n junction is formed |
| 205 | a region is provided with a dopant |
| 301 | Optoelectronic device |
| 303 | Diode |
| 305 | " |
| 307 | Characteristic curve for diode 305 |
| 309 | Characteristic curve for diode 303 |
| 401 | Optoelectronic device |
| 403 | Via |
| 405 | Mesa edge |
| 501 | Dopant |
| 601 | Optoelectronic device |
| 603 | V pit |
| 605 | Growth direction |
| 801 | Zone with reduced reverse voltage |
| 901 | Thickness of the doped region outside the V pit |
| 903 | Thickness of the doped region within the V pit |
| 1001 | Optoelectronic device |
| 1101 | " |
| 1101 A | " |
| 1101 B | " |
| 1201 | Mesa trench |
| 1301 | Transition regions |
| 1303 | Reflective layer |
| 1305A, 1305B | Optoelectronic devices |
| 1401 | Optoelectronic device |
| 1701 | Passivation layer |
| 1801 | n-contact layer |
| 1901 | Optoelectronic device |
| 2001 | " |
| 2002 | overlapping region of the n-doping and p-doping in the p-doped semiconductor layer |
| 2003 | Current flow for reverse breakdown |
| 2101 | Protective layer |
| 2201 | Removed region |
| 2301 | Optoelectronic device |
| 2303 | Passivation layer |
| 2304 | Horizontal surface |
| 2305 | Edge |
| 2307, 2309 | Vertical surfaces |

DETAILED DESCRIPTION

Our optoelectronic device may comprise: a carrier on which a semiconductor layer sequence is applied that comprises an n-doped and a p-doped semiconductor layer and, so, a p-n junction is formed that comprises an active zone that generates electromagnetic radiation, wherein at least one of the n-doped and p-doped semiconductor layers comprises a doped region having a first doping concentration greater than a second doping concentration in a surrounding area of the region in the semiconductor layer comprising the region.

Our method of producing an optoelectronic device includes a semiconductor layer sequence applied on a carrier and comprises an n-doped and a p-doped semiconductor layer and, so, a p-n junction is formed that comprises an active zone that generates electromagnetic radiation, wherein a region of the at least one of the n-doped and p-doped semiconductor layers is provided with a dopant so that the region is doped with a first doping concentration greater than a second doping concentration in a surrounding area of the region in the semiconductor layer comprising the region. That is to say in particular that a region of the semiconductor layer sequence that comprises at least one of the n-doped and p-doped semiconductor layers is provided with the dopant.

The carrier may be formed as a growth substrate that in general can also be referred to as a 'substrate'. In particular, the individual layers of the semiconductor layer sequence, i.e. in particular the n-doped and p-doped semiconductor layer, are then applied or grown on such a growth substrate. The region can then be doped in particular during growth of the semiconductor layers. In particular, alternatively or in addition, the region can be doped after growth of the semiconductor layers. This is particularly when the semiconductor layer sequence is still to be arranged on the growth substrate. The growth substrate can, for example, comprise or be formed of sapphire.

After growth of the semiconductor layers of the semiconductor layer sequence on the growth substrate, a carrier substrate may be arranged on the surface of the semiconductor layer sequence, wherein the surface is formed facing away from the growth substrate. Therefore, the growth substrate and the carrier substrate lie opposite one another, wherein the semiconductor layer sequence is provided or formed or arranged between the growth substrate and the carrier substrate. In particular in this arrangement, alternatively or in addition, the region may be correspondingly doped. The carrier substrate can, in particular, comprise or be formed of germanium or silicon.

After arranging the carrier substrate, the growth substrate may be detached or removed from the semiconductor layer sequence. The carrier substrate then in this case in particular forms the carrier, wherein, alternatively or in addition, the region may then be doped. The carrier substrate is thus not to be equated with the growth substrate.

Doping the region(s), i.e. providing the n-doped and/or p-doped semiconductor layer with a corresponding doping concentration, includes in particular that the region(s) is/are correspondingly doped during the growth or formation of the semiconductor layer sequence. In particular, this includes, in addition or alternatively, that the region(s) is/are correspondingly doped, for example, using a sputtering process, subsequently, i.e. after the growth or formation of the semiconductor layer sequence.

In general, provision can in particular be made that the region is preferably doped when a growth substrate is provided as the carrier. In particular, provision can generally be made that the region is doped, alternatively or in addition, when a carrier substrate is provided as the carrier, for example.

In general, statements made in relation to one region also apply to a plurality of regions, and vice versa.

We thus provide in particular the concept of providing at least one of the two doped semiconductor layers with a region having a higher doping or doping concentration than the semiconductor layer that comprises this region. That is to say in particular that the doped semiconductor layer is not homogeneously doped but rather comprises a heterogeneous doping or a heterogeneous doping concentration. Different regions of the doped semiconductor layer are thus in particular doped differently. If the semiconductor layer comprises a plurality of such regions, then reference can be made to a modulated doping or a modulation in the doping. That is to say in particular that these regions effect such a modulated doping.

By providing these doped regions having a higher or greater doping concentration, a breakdown behavior is advantageously achieved in relation to this region that is different from a breakdown behavior in relation to a surrounding area of the doped region. In particular, the regions having the first doping concentration have a lower breakdown voltage, particularly in the reverse direction, than the surrounding regions or the surrounding area of the region having the first doping concentration. The surrounding area of the region thus has in particular a higher or greater breakdown voltage in the reverse direction.

It is particularly possible that the device comprises a multiplicity of doped regions, wherein the doped regions are arranged laterally spaced apart from one another. The lateral directions are those directions that extend in parallel with a main extension plane, for example, the n-doped semiconductor layer. Regions having the second doping concentration can be provided between adjacent doped regions in each case. The regions of high dopant concentration and low dopant concentration can thus alternate in the lateral direction. By way of this modulation of the dopant concentration, the breakdown voltage is also modulated in the lateral direction.

A forward direction for the p-n junction is defined as follows: a negative pole of a voltage source is applied or arranged on the n-doped semiconductor layer. A positive pole of the voltage source is arranged or applied on the p-doped semiconductor layer. The electric current flows from the p-doped semiconductor layer towards the n-doped semiconductor layer. This is generally the case for operation of the device when the device generates electromagnetic radiation.

A reverse direction for the p-n junction is defined as follows: the positive pole of the voltage source is applied on the n-doped semiconductor layer. The negative pole of the voltage source is applied on the p-doped semiconductor layer. An electric reverse current flows merely owing to the generated minority charge carrier.

By virtue of the fact that regions having a lower breakdown voltage are formed, potential electrostatic discharges can flow off quickly and in a homogeneously distributed manner and a voltage that is sufficiently high to cause possible damage to, or to destroy, the device cannot build up. Therefore, the optoelectronic device is advantageously protected against damage caused by electrostatic charges.

By virtue of the fact that this protection against damage caused by electrostatic discharges is encompassed by the semiconductor layer sequence, in particular there is advantageously no need to provide external protective elements such as external protective diodes, for example. These external protective elements are generally formed separately from the semiconductor layer sequence and are connected thereto accordingly. However, this requires a sufficiently large construction space. Therefore, owing to the omission of external protective elements, a required construction space for the optoelectronic device is reduced compared to known optoelectronic devices that comprise such external protective elements.

The internal protective element, i.e. the doped region having the first doping concentration, also does not reduce a brightness of emitted electromagnetic radiation, and there is no loss in efficiency owing to the provision of the internal protective element.

Therefore, an ESD protection is effected without a loss in efficiency occurring.

That is to say in particular that owing to the internal protective elements, i.e. the doped region having the first doping concentration, being incorporated directly into the semiconductor layer sequence or onto the semiconductor layer sequence, there is no need to provide external protective elements. Stability of the optoelectronic device with respect to electrostatic discharges is therefore advantageously increased. Furthermore, no particular epitaxy with respect to the growth of the individual semiconductor layers of the semiconductor layer sequence is required, which considerably simplifies the production process and can reduce costs and production time.

It is therefore advantageously possible to produce cost-favorable and space-saving optoelectronic devices that are ESD secure. 'ESD secure' means here in particular resistant to electrostatic discharges. "ESD" is an abbreviation of Electrostatic Discharge.

It is noted that the preceding statements and the following statements are always applicable for the method and the device, even if specific reference is made just to the device or just to the method in a particular example. When examples refer to the n-doped semiconductor layer, the corresponding statements also apply to the p-doped semiconductor layer, and vice versa. When examples refer only to one doped region, the corresponding statements also apply to a plurality of doped regions, and vice versa.

'Doping' includes in particular that the dopant is introduced into the semiconductor layer. In particular, doping can also include that a doping layer comprising the dopant is formed on the surface of the semiconductor layer. The doped region can be formed in particular when doping a semiconductor layer to form the n-doped or p-doped semiconductor layer.

A plurality of doped regions may be provided. These doped regions can be formed, for example, identically or, in particular, differently. Nevertheless, these doped regions, even if they can be formed differently, i.e. have in particular different doping concentrations, always have a higher doping concentration than an immediately surrounding area of the respective region, i.e. in particular directly adjacent to this doped region, in the corresponding doped semiconductor layer. In particular, a plurality of doped regions can be provided in the n-doped semiconductor layer. Preferably, a plurality of doped regions can be provided in the p-doped semiconductor layer.

The region may extend laterally in relation to a growth direction of the semiconductor layers onto a growth substrate. That is to say in particular that a lateral extent of the region in relation to the growth direction is greater than a transverse extent. The doped region has in particular a rectangular shape. Preferably, the doped region has a square shape. An edge length of the square or of the rectangle can be in particular 3 µm.

The region may be n-doped and the second doping concentration is the doping concentration of the n-doped semiconductor layer.

The following dopant can be provided as dopants for an n-doping: silicon (Si). That is to say in particular that the n-doped region and/or the n-doped semiconductor layer is/are doped with the dopant. Such a dopant can in particular also be referred to as an n-dopant. A doping concentration relating to n-dopants can in particular also be referred to as an n-doping concentration. In particular, other known n-dopants can additionally or alternatively also be provided, e.g. germanium (Ge) and/or selenium (Se) and/or oxygen (O) and/or sulfur (S) and/or tellurium (Te).

The region may be p-doped and the second doping concentration is the doping concentration of the p-doped semiconductor layer. The statements made in relation to the n-doped region and the n-doped semiconductor layer apply, mutatis mutandis, to the p-doped region and the p-doped semiconductor layer, and vice versa.

The following dopants can be used for a p-doping: magnesium (Mg) and/or carbon (C). That is to say in particular that the p-doped region and/or the p-doped semiconductor layer can be doped with one or both of the dopants referred to in particular as p-dopants. A doping concentration relating to p-dopants can in particular also be referred to as a p-doping concentration. In particular, other known p-dopants can additionally or alternatively also be provided, e.g. beryllium (Be) and/or zinc (Zn).

The n-doped semiconductor layer may comprise an n-doped region having a first n-doping concentration higher than a second n-doping concentration in a surrounding area of the n-doped region in the n-doped semiconductor layer, and also the p-doped layer comprises such a p-doped region having a first p-doping concentration higher than a second p-doping concentration in a surrounding area of the p-doped region in the p-doped semiconductor layer.

The n-doped semiconductor layer may comprise a plurality of n-doped regions having first n-doping concentrations and preferably the p-doped semiconductor layer comprises a plurality of p-doped regions having first p-doping concentrations. The respective first n-doping concentrations and/or the respective first p-doping concentrations can preferably be the same or different. Nonetheless, they are always higher than the second n-doping concentration and second p-doping concentration respectively.

The region may be formed to extend to the p-n junction and in particular to contact the same. As a result, in an advantageous manner, a zone is formed in the transition between the doped region and the p-n junction, which zone has Zener diode-like behavior. That is to say in particular that owing to the provision of the doped region, almost an internal Zener diode is formed in the semiconductor layer sequence, which Zener diode can effect protection against damage caused by electrostatic discharges in a similar manner to external Zener diodes.

The region may be formed to extend through the p-n junction and to connect the two doped semiconductor layers. That is to say in particular that the doped region extends from one doped semiconductor layer through the p-n junction into the other doped semiconductor layer. An internal Zener diode is also advantageously formed in this case. Owing to the direct connection between the two doped semiconductor layers, further improved contacting and a further reduced breakdown voltage are achieved and, in an advantageous manner, further greater protection against damage caused by electrostatic discharges can be achieved.

The region may be formed adjacent to a defect formed in the semiconductor layer comprising the region. That is to say in particular that the n-doped semiconductor layer and/or the p-doped semiconductor layer each have a defect, wherein the doped region is formed adjacent to this defect. 'Adjacent' includes when the doped region is in direct contact with the defect. That is to say in particular that, for example, no further layers are formed between the defect and the region. The region may be formed indirectly adjacent to the defect. That is to say in particular that, for example, one or more layers are provided between the defect and the region.

A plurality of defects can be formed, i.e. in particular a plurality of defects in the n-doped semiconductor layer and/or preferably in the p-doped semiconductor layer. The defects are formed, in particular, to be the same or, preferably, different.

The defect can be a V pit. Such a V pit can be formed, for example, in specific growth conditions. A V pit refers in particular to a crystal defect, in particular an open hexagonal crystal defect which may preferably occur on dislocations, wherein the V pit can generally have the shape of a "V", as seen in a cross-sectional view. That is to say in particular that such defects always become larger in the growth direction relative to a growth direction of the semiconductor layers on a growth substrate, in particular always become larger until mutual collision, and so can be recognized as a "V" in cross section.

The defect may be an epi tube. An epi tube refers in particular to an extremely thin crystal defect and, in particular, such a crystal defect has a diameter of <1 μm. In particular, a diameter can be a few nanometers, in particular 0.1 nanometers. The diameter can thus be in particular 0.1 nanometers to 1 μm. Such thin crystal defects can be drawn or extend in particular vertically through wide zones or even through wider layers of the semiconductor layer sequence. Such epi tubes have, in particular, a constant diameter in the growth direction. Such crystal defects can be formed, in particular, on dislocations or occur at such dislocations and can be hollow, for example.

Such defects such as a V pit or epi tube, for example, can have an intrinsic Zener diode behavior and then in this respect have a reduced breakdown voltage relative to the regions surrounding the defects. Such defects have this intrinsic Zener diode behavior in particular when the defect is p-doped and also n-doped. That is to say in particular that such a defect can be formed within the active zone. By providing the doped regions at such defects, an already provided diode behavior or an already provided Zener diode behavior is advantageously further increased, which can thus advantageously lead to a further reduced breakdown voltage, whereby then a further improved protection against damage caused by electrostatic discharges can again be achieved. The already provided ESD protection by such defects is thus still further increased in an advantageous manner.

A defect can be formed or can occur in particular in an n-doped semiconductor layer or a p-doped semiconductor layer or in an undoped semiconductor layer or in a p-doped and n-doped semiconductor layer, e.g. in the active zone for generating electromagnetic radiation. In a plurality of defects, these can be formed or can occur preferably in each case in any of the aforementioned possibilities.

The region may be formed adjacent to a via formed in the semiconductor layer comprising the region. A via refers in particular to a recess or an opening or a cavity in the semiconductor layer sequence. That is to say in particular that such a via comprises, in its vicinity, a doped region having an increased doping concentration. 'Adjacent' includes in particular a direct vicinity. That is to say in particular that, for example, no further layers are formed between the via and the doped region. The doped region is thus in particular in direct or immediate contact with the via. It can be provided in particular in indirect vicinity. That is to say in particular that the doped region can be arranged indirectly adjacent to the via. Indirectly adjacent thus refers in particular to the case that one or more layers or semiconductor layers can be provided between the doped region and the via.

The via can be partially or completely filled with a dopant.

The via can be formed as a trench, in particular as a mesa trench. In particular, the opposite walls of the trench can be provided with a dopant.

The region may be formed on an outer surface facing away from the semiconductor layer sequence of the semiconductor layer comprising the region. That is to say in particular that a doped semiconductor layer can be applied to such an outer surface, which semiconductor layer then forms this doped region.

The wording that the doped semiconductor layer comprises the doped region includes when the doped region is applied on an outer surface of the semiconductor layer. The wording includes in particular that the doped region is formed directly in the doped semiconductor layer.

Such an outer surface can be, for example, an edge or in particular a mesa edge of the semiconductor layer sequence.

The doped region may have an area of at least 25 μm². Preferably, the region can have a length of at least 5 μm and a width of at least 5 μm. That is to say in particular that the region can have an area of at least 5 μm×5 μm.

A defect may be formed in at least one of the doped semiconductor layers, which defect is provided with the dopant, and the doped region is formed adjacent to the defect.

A via may be formed in at least one of the doped semiconductor layers, into which via the dopant is introduced, and the doped region is formed adjacent to the via.

Prior to providing the region with the dopant, at least one exposed area, i.e. one which is in particular uncovered or is not covered, of the semiconductor layer sequence may be provided with a protective layer against doping with the dopant. This ensures in an advantageous manner that further semiconductor layers of the semiconductor layer sequence are not contaminated or soiled by the dopant. For instance, in particular in an advantageous manner a p-doping of the p-doped semiconductor layer is not damaged when providing an n-doped dopant for an n-doped region. In particular, such damage of an n-doping of the n-doped semiconductor layer can be avoided if the dopant is a p-dopant.

Prior to providing the region with the dopant, i.e. prior to doping, one or more regions of the semiconductor layer sequence that do not belong to the doped semiconductor layer to be provided with the doped region are removed, and in a subsequent doping step the semiconductor layer in which it is desired to form the doped regions having an increased doping concentration is preferably doped. Therefore, there is in particular no risk of contamination by doping in the other semiconductor layers since these are located at a sufficient distance to the doping zone owing to the removal of some regions.

The carrier can be formed as a substrate, in particular, as a growth substrate.

The semiconductor layer sequence may include still further layers such as, for example, reflective layers, contacting layers or anti-reflective layers.

The above-described properties, features and advantages and the manner in which they are achieved, will be understood more clearly in conjunction with the following description of the examples which will be explained in more detail in conjunction with the drawings.

Hereinafter, like features are provided with like reference numerals.

FIG. 1 shows an optoelectronic device 101.

The optoelectronic device 101 comprises a carrier 103 that can be formed, for example, as a substrate, in particular as a growth substrate. A semiconductor layer sequence 105 is applied on the carrier 103. The semiconductor layer sequence 105 includes a p-doped semiconductor layer 107 and an n-doped semiconductor layer 109. A p-n junction 111 is formed between the n-doped semiconductor layer 109 and the p-doped semiconductor layer 107 and comprises an active zone 113 that generates electromagnetic radiation.

In the optoelectronic device 101, the individual semiconductor layers of the semiconductor layer sequence 105 are applied to the carrier 103 in the following sequence as seen from the carrier: the p-doped semiconductor layer 107, the p-n junction 111 and the n-doped semiconductor layer 109.

In one example, not shown, the n-doped semiconductor layer 109 is applied first, as seen from the carrier 103.

In other examples, not shown, the semiconductor layer sequence 105 comprises still further layers, in particular further semiconductor layers such as, for example, reflective layers and/or contacting layers that contact the n-doped and p-doped semiconductor layer.

The n-doped semiconductor layer comprises a doped region 115 formed in the n-doped semiconductor layer 109. The doped region 115 has a first doping concentration higher than a second doping concentration in a surrounding area of the region 115, wherein the second doping concentration corresponds to the doping concentration of the n-doped semiconductor layer 109. That is to say in particular that a higher concentration of n-dopants is provided in the doped region 115 compared to the n-doped semiconductor layer 109.

Furthermore, the n-doped semiconductor layer 109 includes a further doped region 117 provided with a third doping concentration that is likewise higher than the second doping concentration. The further doped region 117 extends as far as the p-n junction 111, and an internal diode, in particular a Zener diode, is advantageously formed in this region.

Furthermore, the n-doped semiconductor layer 109 includes a still further doped region 119 having a fourth doping concentration that is likewise higher than the second doping concentration. This n-doped region 119 extends from the n-doped semiconductor layer 109 through the p-n junction 111 comprising the active zone 113 into the p-doped semiconductor layer 107, and the further n-doped region 119 connects the two doped semiconductor layers 107 and 109 to each other.

By providing such doped regions, in an advantageous manner a breakdown voltage is reduced at these regions as seen in the reverse direction, and in an advantageous manner potential electrostatic discharges can rapidly flow off via these regions. This advantageously effects a protection against damage caused by electrostatic discharges.

In examples, not shown, provision can be made that from the doped regions 115, 117, 119, a plurality of such doped regions can be formed in each case. In particular, for example, merely one type of these regions 115, 117, 119 is provided, i.e. in particular only regions 115 or only regions 117 or only regions 119.

In another example, not shown, in addition to or instead of the n-doped regions 115, 117, 119, corresponding p-doped regions can be provided in the p-doped semiconductor layer 107. The statements made in relation to the n-doped regions 115, 117 and 119 apply, in particular mutatis mutandis, to the p-doped regions and the p-doped semiconductor layer 107, and vice versa. Therefore, electrostatic discharges are also able to flow off via the p-doped semiconductor layer.

Figure 2:
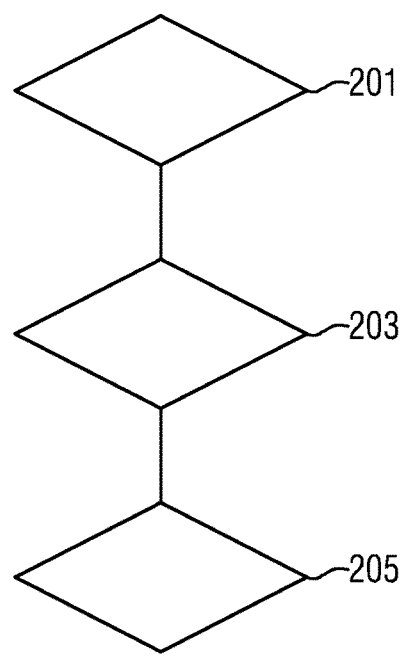
FIG. 2 shows a flow diagram of a method of producing an optoelectronic device.

FIG. 2 shows a flow diagram of a method of producing an optoelectronic device.

According to a step 201, a semiconductor layer sequence is applied on a carrier, in particular on a substrate, for example, on a growth substrate. The semiconductor layer sequence comprises an n-doped and a p-doped semiconductor layer. That is to say in particular that according to step 201, an n-doped semiconductor layer and a p-doped semiconductor layer are applied on the carrier.

According to a step 203, by applying the n-doped and p-doped semiconductor layers, a p-n junction is formed that comprises an active zone that generates electromagnetic radiation.

According to a step 205, a region of the at least one of the n-doped and p-doped semiconductor layers is provided with a dopant, and the region is doped with a first dopant concentration higher than a second dopant concentration in a surrounding area of the region in the semiconductor layer comprising the region.

That is to say in particular that, for example, the n-doped semiconductor layer is provided with an n-dopant, and one or more regions having increased n-doping are formed. The statements in relation to a n-doped semiconductor layer comprising an n-doped region having a higher or greater doping concentration apply, mutatis mutandis, to the p-doped semiconductor layer that, in this respect, can be doped with a p-dopant, and a region or regions having a higher or greater doping concentration than the p-doped semiconductor layer can be formed in the p-doped semiconductor layer.

FIG. 3 shows a further optoelectronic device 301.

The optoelectronic device 301 comprises a semiconductor layer sequence 105 having a p-doped semiconductor layer 107 and an n-doped semiconductor layer 109. For the sake of clarity, a carrier for the optoelectronic device 301 is not illustrated. Such a carrier can be provided, for example, on the side of the p-doped semiconductor layer 107 or on the side of the n-doped semiconductor layer 109. For the sake of clarity, the p-n junction comprising the active zone is likewise not illustrated.

The optoelectronic device 301 comprises three doped regions 117 formed in the n-doped semiconductor layer 109, where these doped regions 117 are n-doped and have a higher doping concentration than the n-doped semiconductor layer 109. These doped regions 117 extend laterally in the n-doped semiconductor layer 109 and contact the p-doped semiconductor layer 109.

Owing to the provision of such doped regions 117, quasi-internal diodes are formed in the semiconductor layer sequence 105. This is illustrated symbolically by the corresponding electronic symbol having the reference numeral 305, specifically in this case the electronic symbol for a diode. For comparison therewith, an electronic symbol having the reference numeral 303 is provided, that is likewise the electronic symbol for a diode. This diode electronic symbol 303 is illustrated between the n-doped semiconductor layer 109 and the p-doped semiconductor layer 107, at which location there is no doped region 117. The diode electronic symbol 303 is illustrated larger than the diode electronic symbol 305. This is because at this location a larger breakdown voltage must be applied before breakdown occurs.

This different breakdown behavior of the two diodes 303 and 305 is illustrated in a graph in FIG. 3. The current I is plotted with respect to the voltage U. The characteristic curve for the diode 305 has the reference numeral 307. The characteristic curve for the diode 303 has the reference numeral 309. The regions having an increased n-doping, i.e. regions 117, have a lower breakdown voltage.

Figure 4:
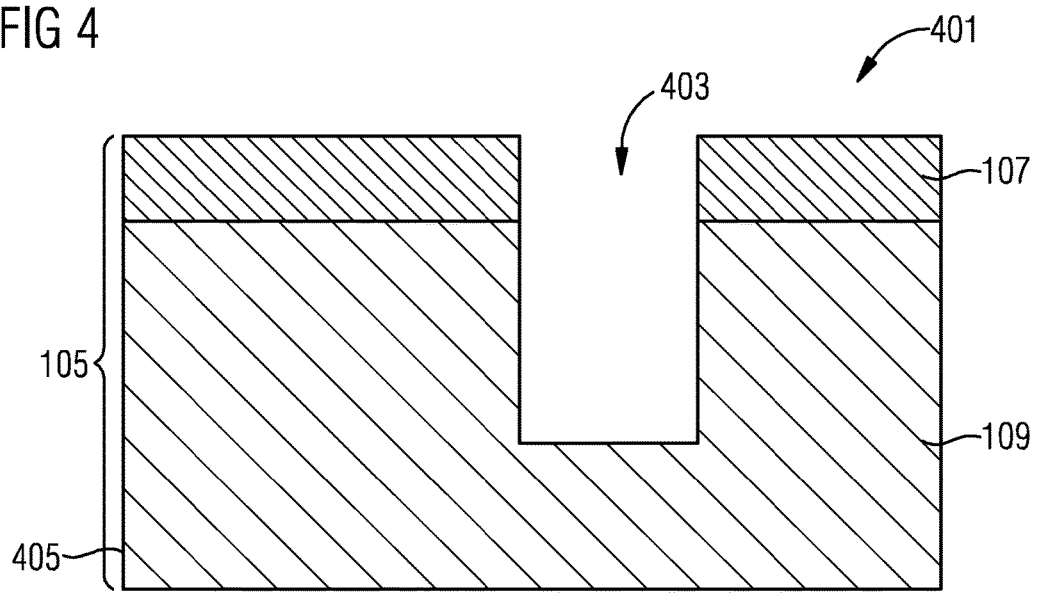
FIGS. 4 and 5 show another optoelectronic device at different points in time of production.
Figure 5:
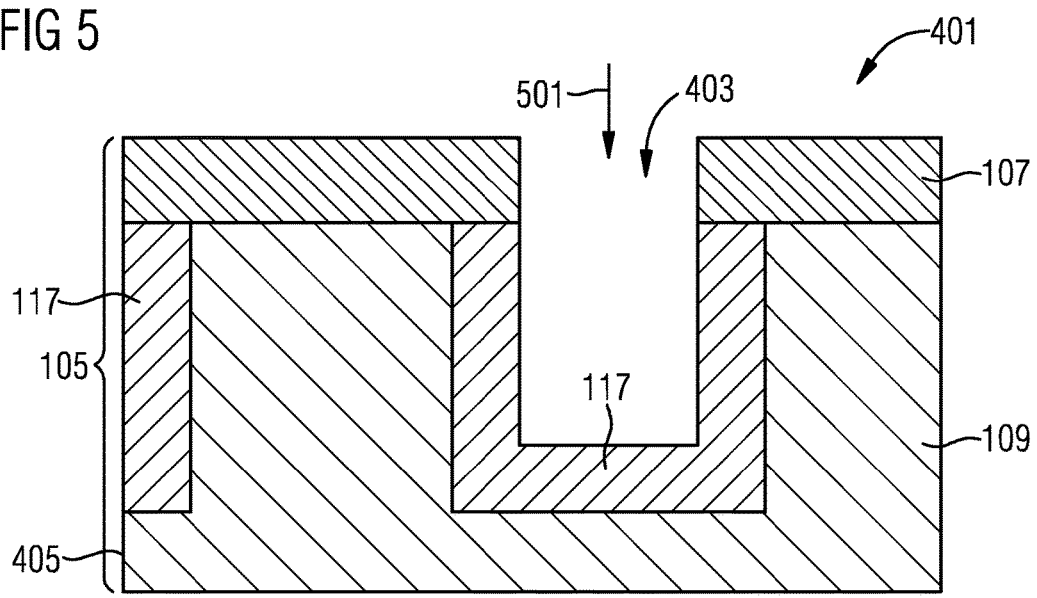

FIGS. 4 and 5 show a further optoelectronic device 401 at different points in time of production.

FIG. 4 illustrates the semiconductor layer sequence 105 comprising the n-doped semiconductor layer 109 and the p-doped semiconductor layer 107. Furthermore, a recess 403, also referred to as a via, has already been formed in the semiconductor layer sequence 105. The via 403 may have been etched, for example. The via 403 extends through the p-doped semiconductor layer 107 and the n-doped semiconductor layer 109.

An n-dopant is then introduced into this via 403 and this is illustrated by way of example or symbolically by an arrow having the reference numeral 501. Owing to the introduction of such a dopant, in this case in particular an n-dopant, regions that are formed adjacent to the via 403 in the n-doped semiconductor layer 109 are provided with a higher n-doping. N-doped regions 117 are thus formed in the n-doped semiconductor layer 109 and extend immediately adjacent to the via 403.

Furthermore, the optoelectronic device 401 has exposed outer surfaces of the semiconductor layer sequence 105 that can also be referred to as edges, in particular as mesa edges 405. An n-dopant can likewise be introduced into the n-doped semiconductor layer 109 at these exposed outer surfaces, in particular these mesa edges 405 and, therefore, n-doped regions 117 are also formed in these regions of the n-doped semiconductor layer 109, the n-doped regions having a higher doping concentration than the n-doped semiconductor layer 109.

The n-dopant can be applied in particular such that an n-doping layer is formed on the outer surface and then forms the doped region. The same applies for the p-dopant.

Although FIGS. 4 and 5 illustrate an optoelectronic device 401 provided with regions having an increased n-doping in the n-doped semiconductor layer 109, provision can be made, for example, that corresponding regions can be provided with an increased p-doping in the p-doped semiconductor layer 107 in addition to or instead of the n-doped regions 117 of the n-doped semiconductor layer 109.

FIGS. 6 to 9 show another optoelectronic device 601 at different points in time of production.

FIG. 6 shows the optoelectronic device 601 comprising a carrier 103 that can be formed, for example, as a substrate, in particular as a growth substrate. An n-doped semiconductor layer 109 is applied on the substrate 103, wherein the n-doped semiconductor layer comprises a defect, in this case a V pit 603. Such a V pit 603 refers to a hexagonal crystal defect which is open in a growth direction 605, in this case illustrated by an arrow having the corresponding reference numeral. Such defects become increasingly larger in the growth direction 605 and can thus be recognized as a "V" in cross section.

For the sake of clarity, a three-dimensional view of the V pit 603 is also illustrated accordingly in FIG. 6. That is to say in particular that the semiconductor layer 109 has a V-shaped crystal defect in cross section. In one example, not illustrated, a plurality of such V pits 603 can be formed that can be formed, in particular, to be the same or, for example, to be different.

An n-dopant can be introduced, for example, into the V pit 603 so that, as shown in FIG. 7, an n-doped region 117 is formed in the V pit 603 and is applied to the n-doped semiconductor layer 109. Therefore, the n-doped semiconductor layer 109 comprises a region provided with an increased n-doping compared to the doping concentration in the semiconductor layer 109. The V pit 603 can be filled, in particular, such that the n-dopant penetrates or diffuses into the n-doped semiconductor layer 109 and forms, in the n-doped semiconductor layer 109, higher doped regions accordingly. The same applies for the p-dopant.

According to FIG. 7, the V pit 603 is only partially filled with the n-dopant. In one example, not shown, provision can be made that the V pit 603 is completely filled with an n-dopant.

In FIG. 8, the optoelectronic device 601 is shown in a corresponding production method at a subsequent point in time in relation to FIG. 7. That is to say in particular that the V pit 603 is at least partially, in particular completely, filled with an n-dopant, wherein then a p-doped semiconductor layer 107 is applied—in particular grown in the growth direction 605—on the thus formed layers, i.e. the n-doped semiconductor layer 109 having the at least partially filled V pit 603. The zone comprising the n-doped region 117 has a reduced reverse breakdown voltage and, therefore, electrical charges can flow off thereby, and the optoelectronic device 601 can be protected against damage caused by electrostatic discharges.

FIG. 9 shows one possible variant for the optoelectronic device 601. In this case, the V pit 603 is at least partially filled with the n-dopant in a similar manner to FIGS. 7 and 8. Moreover, a layer of this n-dopant is applied to the exposed surfaces of the n-doped semiconductor layer 109 outside the V pit 603. A layer thickness of this n-dopant layer in the V pit 603 is greater or thicker than in the region outside the V pit 603 on the exposed surfaces extending in parallel with the carrier 103. The layer thickness in the V pit 603 of the n-dopant is illustrated with the double arrow having the reference numeral 903. The thinner layer thickness of the n-dopant outside the V pit is illustrated with the double arrow having the reference numeral 901. In a similar manner to FIG. 8, the p-doped semiconductor layer 107 can be applied, in particular grown, on the layer structure according to FIG. 9.

The statements made in relation to FIGS. 6 to 9 apply, mutatis mutandis, to p-doped semiconductor layers that comprise one or more V pits.

In one example, not shown, the n-doped and p-doped semiconductor layers each comprise one or more V pits that are doped accordingly.

FIGS. 10 to 13 show yet another optoelectronic device 1001 and 1101 respectively at different points in time of production.

FIG. 10 shows an optoelectronic device 1001, wherein the n-doped semiconductor layer 109 has been grown on the carrier 103 as the first layer, as seen from the carrier 103. The carrier 103 can be referred to in particular as a growth substrate or as a substrate since the individual semiconductor layers are grown on the carrier 103.

Figure 11:
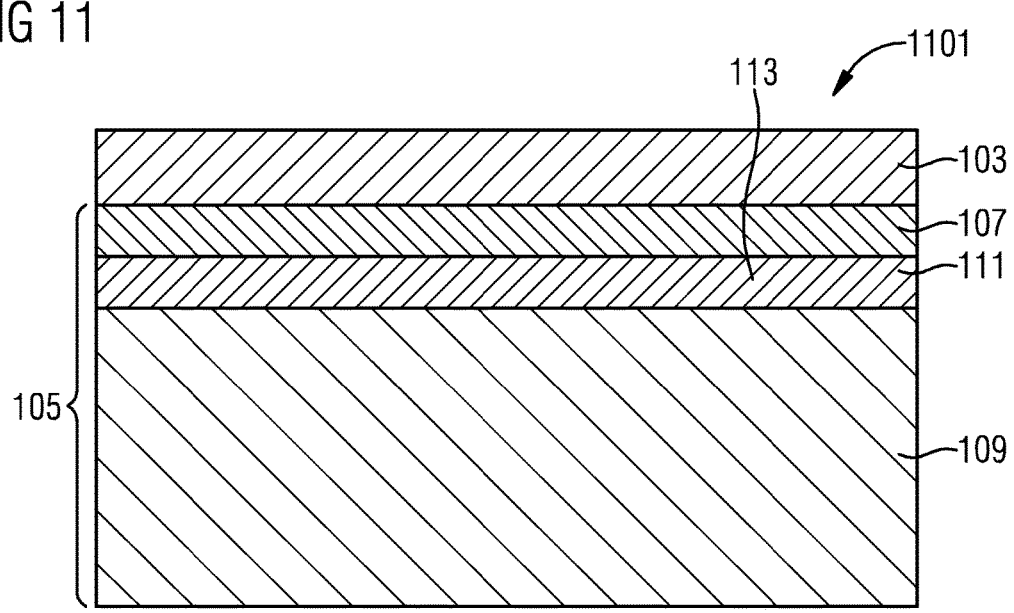

FIG. 11 shows a further optoelectronic device 1101, wherein the p-doped semiconductor layer 107 is provided closer to the carrier 103 than the n-doped semiconductor layer 109.

In particular, provision can be made that the carrier 103 of the optoelectronic device 1001 according to FIG. 10 has been removed, wherein the p-doped semiconductor layer 107 has then been applied or arranged on a further carrier 103 (cf. FIG. 13, lower drawing, this further carrier is illustrated with the reference numeral 1304 therein).

Figure 12:
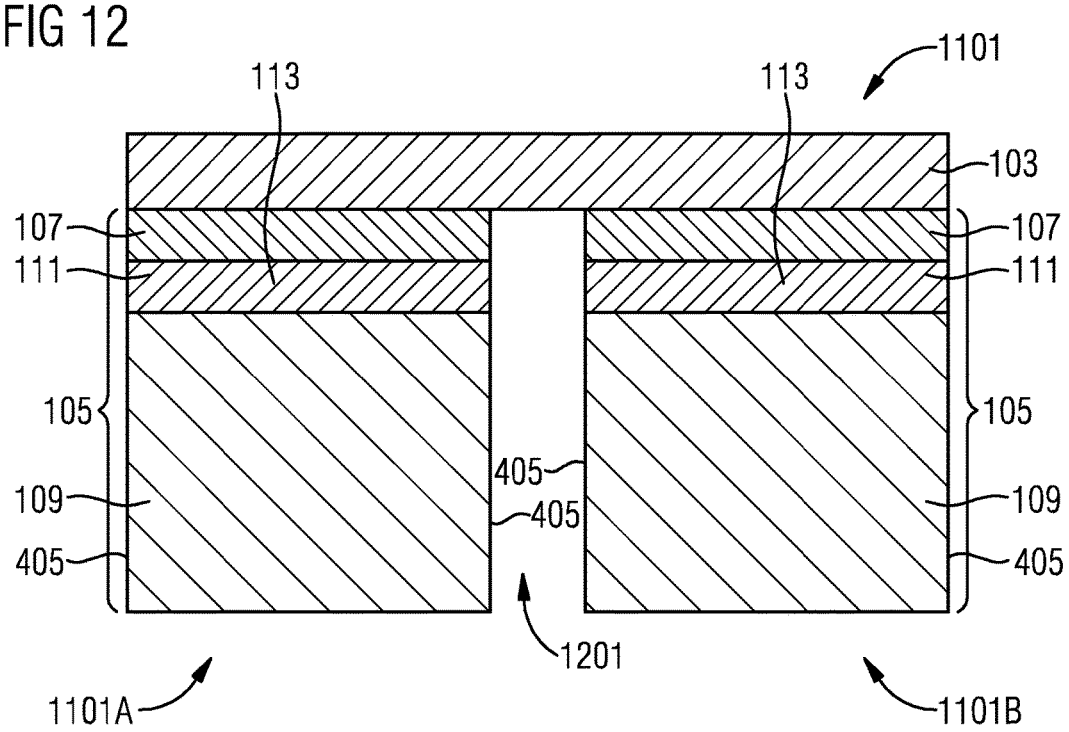
Figure 14:
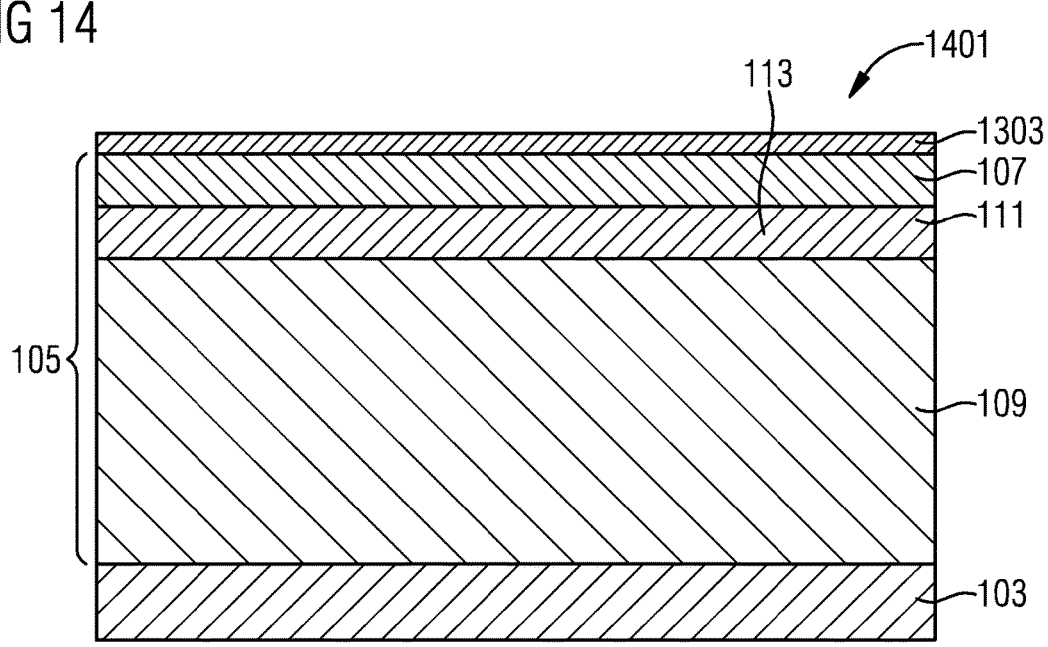
FIGS. 14 to 18 show a still further optoelectronic device at different points in time of production.
Figure 15:
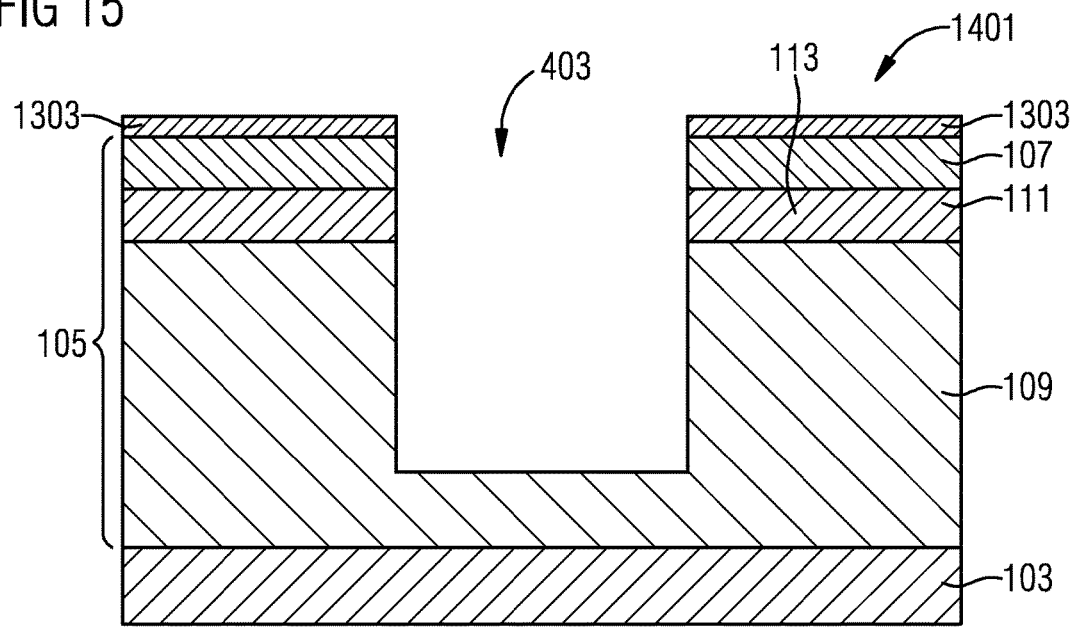

FIGS. 12 and 13 now show the optoelectronic device 1101 at different points in time of production, wherein the relevant statements apply, mutatis mutandis, for the optoelectronic device 1001 according to FIG. 10. FIG. 13 shows possible production variants of the device 1101: a first variant is shown at the top having the reference numeral 1305A and below this a second variant is shown at the bottom having the reference numeral 1305B.

According to FIG. 12, a mesa trench 1201 was etched in the semiconductor layer sequence 105 to the carrier 103. As a result, the semiconductor layer sequence 105 is divided into two parts and thus forms two optoelectronic devices which are illustrated herein with the reference numerals 1101A and 1101B.

Corresponding n-dopants can then be introduced into this etched mesa trench 1201 and, therefore, regions having an increased n-doping are formed on the mesa edges 405 of the semiconductor layer sequence 105 in the mesa trench 1201. In particular, n-dopants are also applied on the mesa edges 405 of the semiconductor layer sequence 105 and on the opposite side in relation to the mesa trench 1201 of the semiconductor layer sequence 105 of the respective devices 1101A and 1101B, i.e. on the sides of the semiconductor layer sequence 105 facing away from the mesa trench 1201.

As shown in both drawings in FIG. 13, n-doped regions 117 are thus formed that extend from the n-doped semiconductor layer 109 via the p-n junction 111 to the p-doped semiconductor layer 107. These transition regions 1301, comprising the n-doped regions 117, from the n-doped semiconductor layer 109 to the p-doped semiconductor layer 109 have a lower reverse breakdown voltage compared to the regions of the semiconductor layer sequence 105 that do not have an increased n-doping.

FIG. 13 shows, at the top, one possible example illustrated with the reference numeral 1305A. In this example, the carrier 103 forms a growth substrate. The growth substrate can be, for example, sapphire.

FIG. 13 shows, at the bottom, a further possible example illustrated with the reference numeral 1305B and is a further development of the device 1305A. In this example, the growth substrate has been removed (element 103 in the device 1305A at the top). Prior to removal, a reflective layer 1303 was applied on the surface of the p-doped semiconductor layer 107 facing away from the growth substrate 103, wherein a carrier substrate 1304, e.g. germanium or silicon, is then applied on this reflective layer 1303 such that it connects the two devices 1101A and 1101B together to carry the same. The growth substrate 103 is then removed. The reflective layer 1303 is then provided in particular if the completely produced device comprises a carrier substrate, and not a growth substrate, as the carrier.

In one example, not shown, provision can be made that exposed surfaces of the optoelectronic devices 1101A and 1101B are provided by a protective layer prior to applying or introducing the n-dopant and, therefore, for example, the p-doped semiconductor layer 107 and/or the active zone 113 of the p-n junction 111 is/are not doped with n-dopants.

The n-dopants can be introduced, for example, by sputtering. In particular, this is quite generally separate from this specific example.

The above statements in relation to an n-dopant and the n-doped semiconductor layer 109 also apply, mutatis mutandis, to the examples in which the p-doped semiconductor layer 107 is doped with a p-dopant and, therefore, regions having an increased p-doping concentration are formed in the p-doped semiconductor layer 107. Such examples can be based on the optoelectronic device 1001 according to FIG. 10. That is to say in particular that, in a similar manner to FIGS. 12 and 13, the optoelectronic device 1001 according to FIG. 10 is also provided with a mesa trench 1201 and is then doped with a p-dopant accordingly.

FIGS. 14 to 18 show an optoelectronic device 1401 at different points in time of production. In this case, in particular, a reflective layer 1303 can be provided similarly to the device 1305B according to FIG. 13. This reflective layer 1303 can also be omitted similarly to the device 1303A according to FIG. 13. The decision as to whether or not provide such a reflective layer 1303 depends in particular upon whether or not the growth substrate is to be removed, i.e. dependent upon whether or not a carrier substrate is to be provided.

In a similar manner to FIGS. 10 to 13, a via 403 or a recess is also etched or formed in the semiconductor layer sequence 105 of the optoelectronic device 1401, wherein, as a difference, the recess 403 does not extend to the carrier 103 but terminates in the n-doped semiconductor layer 109.

Therefore, exposed surfaces of the individual semiconductor layers of the semiconductor layer sequence 105 are formed and can be doped, for example, by an n-dopant and/or p-dopant and, therefore, corresponding doped regions are formed that have an increased doping concentration than, for example, the n-doped semiconductor layer 109 or p-doped semiconductor layer 107 respectively.

Figure 16:
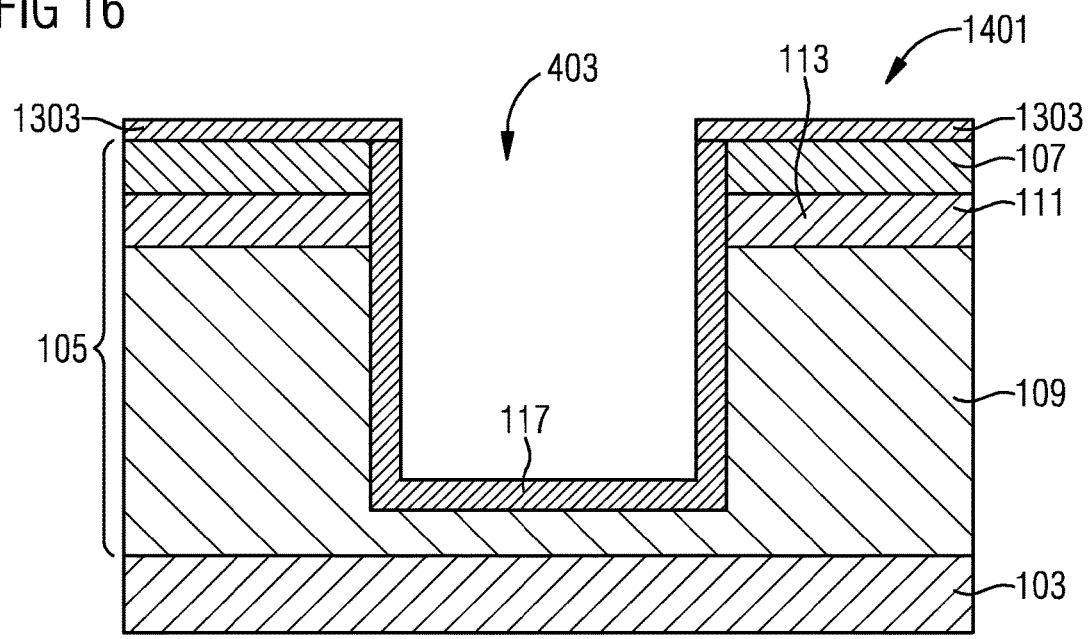

For example, according to FIG. 16, the exposed surfaces in the recess 403 can be doped with an n-dopant, for example, silicon, by introducing, e.g. by sputtering, the corresponding material into the individual layers.

Then, a passivation layer 1701 is applied, e.g. grown, on these doped regions 117 and on the p-doped semiconductor layer 107. For example, provision can be made that this passivation layer 117 according to FIG. 17 also covers a base of the via 403 owing to the growth or introduction or application of the passivation layer 117, wherein the passivation layer 117 is then removed after the lateral walls of the recess 403 are covered by the passivation layer, as also shown in FIG. 17.

Figure 17:
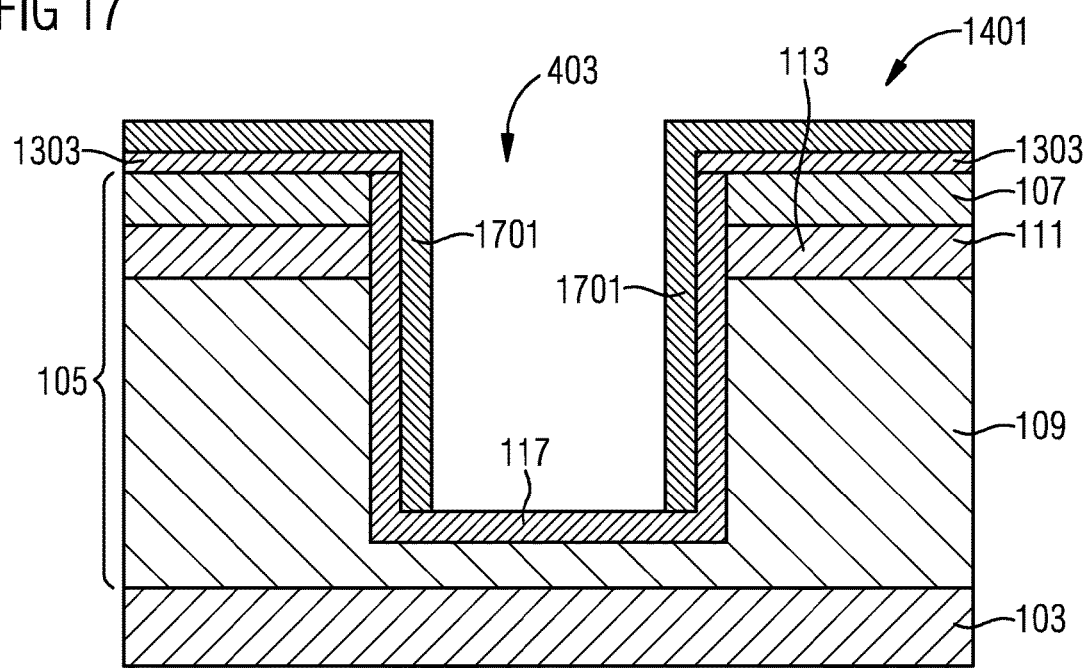
Figure 18:
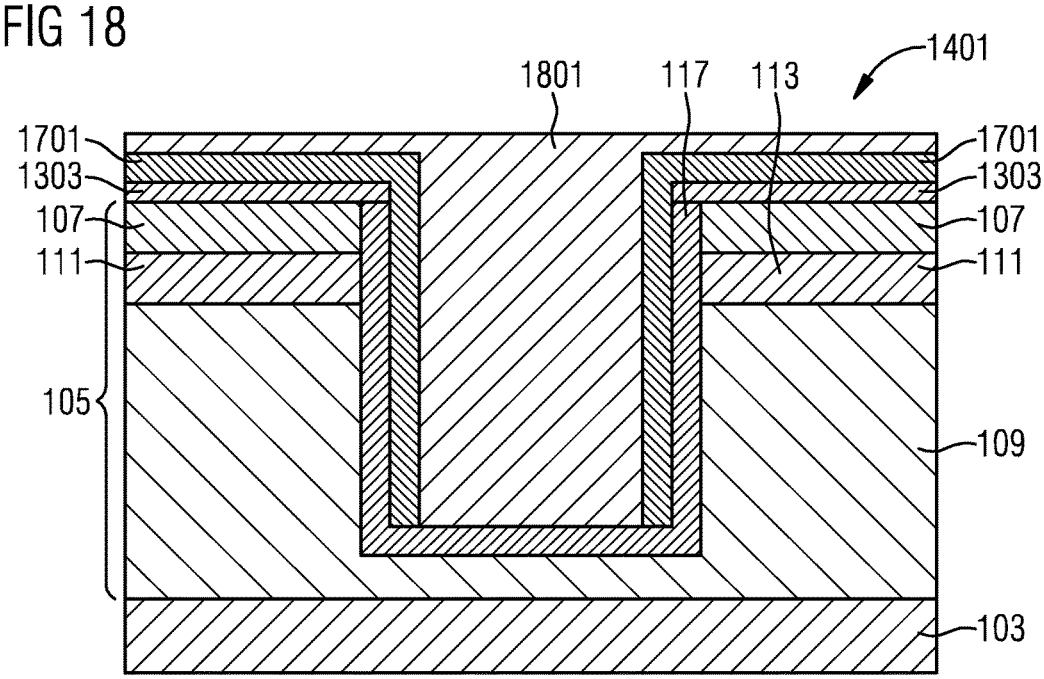

As the next layer, an n-contacting layer 1801 is then applied, in particular grown, on the layer sequence according to FIG. 17, and electrically contacts in particular the n-doped semiconductor layer 109. This is shown in FIG. 18.

Figure 19:
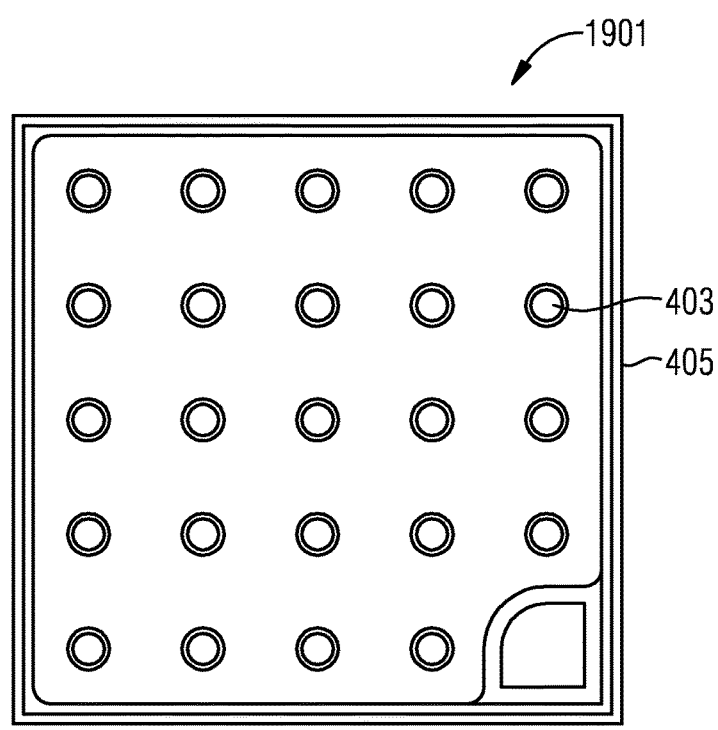
FIG. 19 shows another optoelectronic device at different points in time of production.

FIG. 19 shows another optoelectronic device 1901.

The optoelectronic device 1901 is shown in plan view. The plurality of vias 403 and a circumferential mesa edge 405 can be seen, which mesa edge comprises doped regions, not shown herein, having an increased doping concentration and, therefore, a reduced reverse voltage is achieved across a large area.

Figure 22:
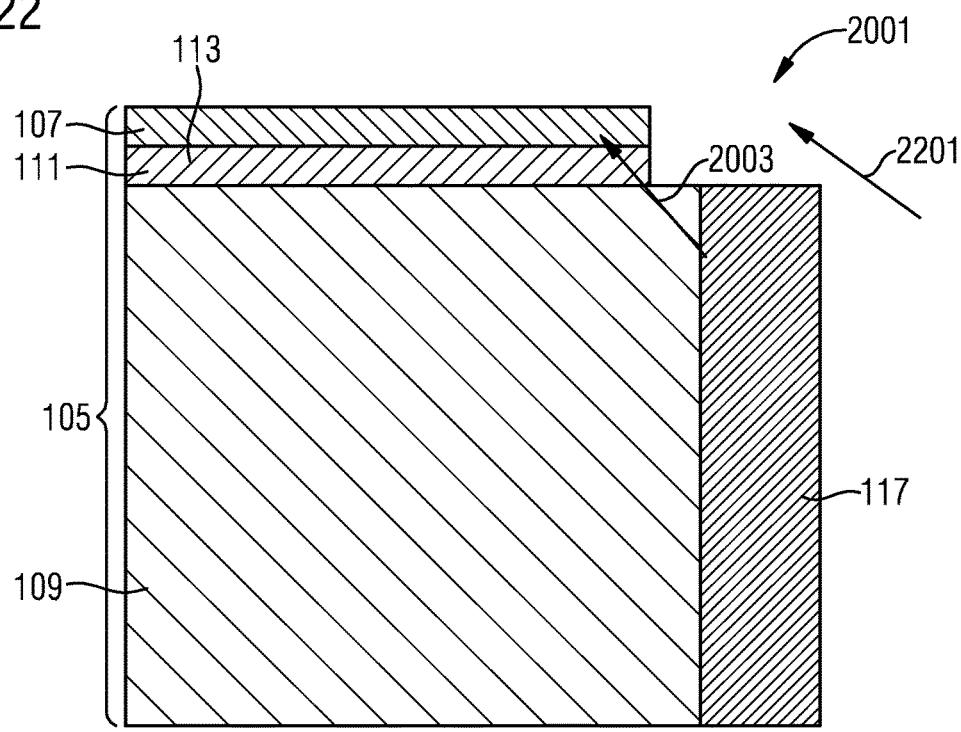

FIGS. 20 to 22 show a further optoelectronic device 2001 at different points in time of production.

For the sake of clarity, a carrier 103 for the semiconductor layer sequence 105 is not illustrated. An n-doped region 117 is formed that is surrounded by the n-doped semiconductor layer 109 and extends through the p-n junction 111 into the p-doped semiconductor layer 107. In a reverse breakdown, a current will flow. This flow of current is illustrated by an arrow having the reference numeral 2003. The reference numeral 2002 designates a hatched region in which the p-doped semiconductor layer 107 and the n-doped region 117 having the increased n-doping overlap. In this case, in this region 2002, it may be that a p-conductivity is reduced owing to the high n-doping. It may optionally be that in this region, the p-doping is destroyed by the n-doping. In this case, a reflective layer 1303 can also preferably be provided. 'Optionally' means in particular that the reflective layer 1303 can also be omitted.

To avoid this, for example, according to FIG. 21, prior to introducing the corresponding n-dopant, i.e. prior to forming the region 117, a protective layer 2101 is applied on the exposed corresponding surface of the p-doped semiconductor layer 107. In particular, this protective layer 2101 can also be applied on a corresponding exposed surface of the active zone 113 of the p-n junction 111. This advantageously ensures that in a subsequent doping step having an n-dopant, no n-dopant penetrates into the active zone 113 and into the p-doped semiconductor layer 107.

According to FIG. 22, alternatively or in addition to the protective layer 2101, regions of the p-doped semiconductor layer 107 and/or of the active zone 113 are removed and, therefore, the corresponding edges of the p-doped semiconductor layer 107 and the active zone 113 no longer extend flush with the n-doped semiconductor layer 109. In particular, in a doping step, only the exposed surface of the n-doped semiconductor layer 109 is doped but not the p-doped semiconductor layer 107 and the active zone 103. The removed regions are schematically illustrated by an arrow having the reference numeral 2201.

Figure 23:
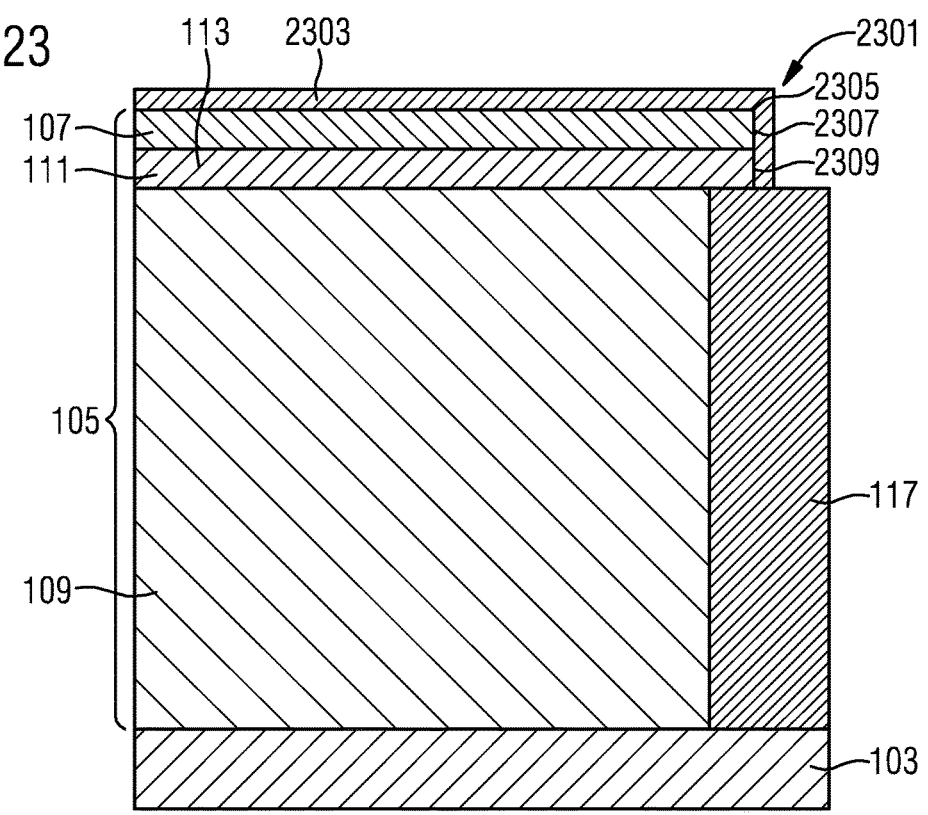
FIG. 23 shows a further optoelectronic device.

FIG. 23 shows a further optoelectronic device 2301 constructed in a substantially similar manner to the device 2001. Reference can be made to the relevant statements.

As an additional feature, the device 2301 comprises a passivation layer 2303 applied on the n-doped semiconductor layer 107. The passivation layer 2303 extends over a horizontal surface 2304 of the n-doped semiconductor layer 107 and furthermore over an edge 2305 of the n-doped semiconductor layer 107 in the direction of the carrier 103 as far as the doped region 117 and thus also covers in particular a perpendicular outer surface 2307 of the n-doped semiconductor layer 107 that abuts or adjoins the edge 2305, and a further perpendicular outer surface 2309 of the p-n junction 111 that adjoins the outer surface 2305.

In summary, we thus include the concept of providing at least one of the two p-doped and n-doped semiconductor layers, in particular both of them, with a modular doping insofar as one or more regions are provided with a higher n-doping or p-doping respectively compared to a surrounding area of the region. As a result, it is advantageously achieved that these regions have a lower breakdown voltage and, therefore, preferably electrical charges can flow off thereby in the case of an electrostatic discharge of the optoelectronic device. This advantageously provides in particular a protection against electrostatic discharges or against damage possibly resulting therefrom.

Our components and methods are illustrated and described in more detail with the aid of the preferred examples. However, the disclosure is not limited to the disclosed examples. Rather, other variations can be derived therefrom by those skilled in the art without departing from the scope of protection of the disclosure.

The invention claimed is:

1. An optoelectronic device comprising:
   a earner on which a semiconductor layer sequence is applied, the semiconductor layer sequence comprising an n-doped semiconductor layer and a p-doped semiconductor layer such that a p-n junction is formed which comprises an active zone that generates electromagnetic radiation, wherein
   at least one of the n-doped semiconductor layer and the p-doped semiconductor layer comprises a doped region having a first doping concentration greater than a second doping concentration in a surrounding area of the region in the semiconductor layer comprising the region,
   either the region is formed to extend to and contact the p-n junction, or the region is formed to extend through the p-n junction and connect the two doped semiconductor layers.

2. The optoelectronic device according to claim 1, having a multiplicity of the doped regions, wherein
   the doped regions each have a lower breakdown voltage in a reverse direction for the p-n junction than the breakdown voltage in the reverse direction in the surrounding areas of the doped regions,
   the doped regions are laterally spaced apart from each other, and
   regions having the second doping concentration are provided between adjacent doped regions.

3. The optoelectronic device according to claim 1, wherein the region is n-doped and the second doping concentration is the doping concentration of the n-doped semiconductor layer.

4. The optoelectronic device according to claim 1, wherein the region is p-doped and the second doping concentration is the doping concentration of the p-doped semiconductor layer.

5. The optoelectronic device according to claim 1, wherein the region is formed adjacent to a defect formed in the semiconductor layer comprising the region.

6. The optoelectronic device according to claim 5, wherein the defect is a V pit.

7. The optoelectronic device according to claim 1, wherein the region is formed adjacent to a via formed in the semiconductor layer comprising the region.

8. The optoelectronic device according to claim 1, wherein the region is formed at an outer surface facing away from the semiconductor layer sequence of the semiconductor layer comprising the region.

9. The optoelectronic device according to claim 1, wherein a plurality of regions are formed, and the semiconductor layer comprising the regions has a modulated doping.

10. The optoelectronic device according to claim 1, wherein the region has an area of at least 25 $\mu m^2$.

11. A method of producing an optoelectronic device comprising:
    applying a semiconductor layer sequence on a carrier and comprises an n-doped and a p-doped semiconductor layer, and
    forming a p-n junction comprising an active zone that generates electromagnetic radiation, wherein
    a region of the at least one of the n-doped and p-doped semiconductor layers is provided with a dopant so that the region is doped with a first doping concentration greater than a second doping concentration in a surrounding area of the region in the semiconductor layer comprising the region, and prior to provision of the region with the dopant, at least one exposed surface of the semiconductor layer sequence is provided with a protective layer against doping with the dopant.

12. The method according to claim 11, wherein a defect is formed in at least one of the doped semiconductor layers, which defect is provided with the dopant, and the doped region is formed adjacent to the defect.

13. The method according to claim 11, wherein a via is formed in at least one of the doped semiconductor layers, into which via the dopant is introduced, and the doped region is formed adjacent to the via.

14. The optoelectronic device according to claim 1, wherein the region is formed adjacent to a defect formed in the semiconductor layer comprising the region, wherein the defect is an epi tube.

15. The optoelectronic device according to claim 14, wherein the epi tube has a diameter of smaller than 1 µm and extends vertically through layers of the semiconductor layer sequence.

16. An optoelectronic device comprising:
a carrier on which a semiconductor layer sequence is applied, the semiconductor layer sequence comprising an n-doped semiconductor layer and a p-doped semiconductor layer such that a p-n junction is formed which comprises an active zone that generates electromagnetic radiation, wherein at least one of the n-doped semiconductor layer and the p-doped semiconductor layer comprises a doped region having a first doping concentration greater than a second doping concentration in a surrounding area of the region in the semiconductor layer comprising the region, the region is formed adjacent to a defect formed in the semiconductor layer comprising the region, wherein the defect is an epi tube, and the epi tube has a diameter smaller than 1 µm and extends vertically through layers of the semiconductor layer sequence.

* * * * *

UNITED STATES PATENT AND TRADEMARK OFFICE
CERTIFICATE OF CORRECTION

PATENT NO. : 9,620,673 B2  
APPLICATION NO. : 14/782911  
DATED : April 11, 2017  
INVENTOR(S) : Meyer et al.

Page 1 of 1

It is certified that error appears in the above-identified patent and that said Letters Patent is hereby corrected as shown below:

In the Claims

In Column 16, at Line 3, please change "earner" to -- carrier --.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*